United States Patent
Milicevic et al.

(10) Patent No.: US 11,956,884 B2
(45) Date of Patent: Apr. 9, 2024

(54) PLASMA CHEMICAL VAPOR DEPOSITION APPARATUS

(71) Applicant: Draka Comteq B.V., Delft (NL)

(72) Inventors: Igor Milicevic, Helmond (NL); Mattheus Jacobus Nicolaas Van Stralen, Tilburg (NL); Gertjan Krabshuis, Sint Oedenrode (NL); Antonius Henricus Elisabeth Breuls, Urmond (NL)

(73) Assignee: Draka Comteq B.V., Delft (NL)

( * ) Notice: Subject to any disclaimer, the term of this patent is extended or adjusted under 35 U.S.C. 154(b) by 190 days.

(21) Appl. No.: 17/747,068

(22) Filed: May 18, 2022

(65) Prior Publication Data

US 2022/0377871 A1 Nov. 24, 2022

(30) Foreign Application Priority Data

May 19, 2021 (NL) ...................................... 2028245

(51) Int. Cl.
*H05H 1/46* (2006.01)
*C23C 16/40* (2006.01)
*C23C 16/511* (2006.01)

(52) U.S. Cl.
CPC ........... *H05H 1/461* (2021.05); *C23C 16/402* (2013.01); *C23C 16/511* (2013.01); *H05H 2245/42* (2021.05)

(58) Field of Classification Search
None
See application file for complete search history.

(56) References Cited

U.S. PATENT DOCUMENTS

| 7,346,244 B2 * | 3/2008 | Gowan | G02B 6/4434 |
| | | | 385/100 |
| 8,135,252 B2 * | 3/2012 | Overton | G02B 6/44384 |
| | | | 385/100 |
| 8,662,011 B2 * | 3/2014 | Van Stralen | C03B 37/01823 |
| | | | 118/723 R |

(Continued)

FOREIGN PATENT DOCUMENTS

| CN | 101093786 A * | 12/2007 | ............. B05D 3/067 |
| CN | 101093786 B * | 12/2010 | ............. B05D 3/067 |

(Continued)

*Primary Examiner* — Srinivas Sathiraju
(74) *Attorney, Agent, or Firm* — Additon, Pendleton & Witherspoon, P.A.

(57) ABSTRACT

The invention relates to a plasma chemical vapor deposition (PCVD) apparatus for deposition of one or more layers of silica onto an interior wall of an elongated hollow glass substrate tube. The apparatus comprises a microwave generator, a plasma generator receiving microwaves from said generator in use, a cylindrical cavity extending through said generator, and a cylindrical liner positioned in the cavity. The substrate tube passes through the liner in use. The cylindrical liner has at least one section having a reduced inner diameter over a part of the length of the liner, the at least one section providing a contact zone for the substrate tube. The microwave generator is configured to generate microwaves having a wavelength Lw in the range of 40 to 400 millimeters, wherein a length of said at least one section having the reduced inner diameter is at most 0.1×Lw.

17 Claims, 1 Drawing Sheet

(56) References Cited

U.S. PATENT DOCUMENTS

| | | | | |
|---|---|---|---|---|
| 8,807,078 | B2* | 8/2014 | Zhang | C03B 37/0183 |
| | | | | 118/723 MW |
| 9,376,753 | B2* | 6/2016 | van Stralen | H01J 37/32256 |
| 10,767,264 | B2* | 9/2020 | van Stralen | C23C 16/511 |
| 2005/0123257 | A1* | 6/2005 | Beaumont | G02B 6/02271 |
| | | | | 385/127 |
| 2007/0289332 | A1* | 12/2007 | Petitfrere | C03B 37/01291 |
| | | | | 65/421 |
| 2007/0295033 | A1* | 12/2007 | Gonnet | H05H 1/30 |
| | | | | 219/121.48 |
| 2008/0056651 | A1* | 3/2008 | Nothofer | G02B 6/4436 |
| | | | | 385/109 |
| 2008/0260343 | A1* | 10/2008 | Quinn | B26D 7/01 |
| | | | | 83/13 |
| 2008/0268174 | A1* | 10/2008 | Korsten | C03B 37/01846 |
| | | | | 427/164 |
| 2008/0282743 | A1* | 11/2008 | Xu | C03B 32/00 |
| | | | | 65/427 |
| 2010/0154479 | A1* | 6/2010 | Milicevic | C03B 37/0183 |
| | | | | 65/400 |
| 2022/0377871 | A1* | 11/2022 | Milicevic | C23C 16/511 |

FOREIGN PATENT DOCUMENTS

| | | | | |
|---|---|---|---|---|
| CN | 102136411 | A * | 7/2011 | B05D 3/067 |
| CN | 102136411 | B * | 6/2013 | B05D 3/067 |
| CN | 108425170 | B * | 2/2021 | B01L 3/502707 |
| EP | 1988065 | A1 | 11/2008 | |

* cited by examiner

PLASMA CHEMICAL VAPOR DEPOSITION APPARATUS

CROSS-REFERENCE TO PRIORITY APPLICATION

This application claims the benefit of pending Dutch Application No. 2028245 (filed May 19, 2021, at the Netherlands Patent Office), which is hereby incorporated by reference in its entirety.

FIELD OF THE INVENTION

The present invention relates to a plasma chemical vapor deposition (PCVD) apparatus.

BACKGROUND

Applicant's European Patent Application No. 1,988,065 A1 and its counterpart U.S. Pat. No. 8,662,011, each of which is hereby incorporated by reference in its entirety, relate to a deposition apparatus for depositing one or more layers of silica onto the interior wall of an elongated hollow glass substrate tube. The apparatus has a resonator and an inner tube extending through the resonator. The inner tube is provided with an inner ring at an end thereof. Such an inner ring maintains an adequate radial positioning of the substrate tube by avoiding excessive tube bending while decreasing the amount of unwanted contact (i.e., the size of the contact zone) between the substrate tube and the inner wall of the inner tube upon contact between the substrate tube and the liner. Such contact may cause damage to the substrate tube and inner tube.

In this regard, it is also observed that radially positioning, or centering, of the substrate tube is also relevant for the uniformity of the deposited layers. An off-centered substrate tube may negatively affect the plasma generation.

SUMMARY

In one aspect, the invention embraces a plasma chemical vapor deposition (PCVD) apparatus that is used for deposition of one or more layers of silica onto an interior wall of an elongated hollow glass substrate tube. The deposition is achieved by flushing a gas through the substrate tube in combination with the generation of plasma. Such substrate tubes, having deposited silica layers, are used for the production of optical fibers. After the deposition, the tube is collapsed in a heating device so as to form a core-rod for optical fibers.

Accordingly, it is an exemplary object of the present invention to provide an improved plasma chemical vapor deposition apparatus. It is another exemplary object of the present invention to provide a plasma chemical vapor deposition apparatus that makes possible a higher quality deposition process.

One or more of these objects are achieved by the plasma chemical vapor deposition apparatus according to the invention for deposition of one or more layers of silica onto an interior wall of an elongated hollow glass substrate tube. An exemplary apparatus includes a microwave generator, a plasma generator receiving microwaves from the microwave generator in use, a cylindrical cavity extending through the plasma generator, and a cylindrical liner that is transparent to microwave radiation and that is positioned in the cavity, a central axis of the liner being coaxial with a central axis of the cavity. The substrate tube passes through the liner in use, wherein, over a portion of the liner's length, the liner has at least one section having a reduced inner diameter with respect to an inner diameter of a remaining part of the liner. The at least one section provides a contact zone for the substrate tube. The microwave generator is configured to generate microwaves having a wavelength Lw in the range of 40 to 400 millimeters, wherein a length of said at least one section has the reduced inner diameter is typically at least 1 millimeter and at most 0.1×Lw.

The specific definition of the length of said at least one section having the reduced inner diameter results in a more stable temperature of the liner and particularly said at least one section of the liner. The inventors have found that, in particular, a too-large length of said at least one section with respect to the wavelength of the microwave generation used in use of the apparatus, negatively affects the temperature stability of the section, because the temperature of the section will then increase too much due to absorption of microwave radiation. This absorption may occur as a result of pollution and damage of the inner surface of the section such as resulting from contact with the substrate tube. Such unwanted increased temperature would locally influence substrate tube temperature in an undesired manner in turn, in case of contact between the substrate tube and the section of the liner, and would thereby decrease a quality of the deposition. In particular, the incorporation efficiency of germanium dioxide ($GeO_2$) would be significantly affected by such unwanted contact between the substrate tube and an excessively heated section of the liner, as a result increasing the variability of the refractive index of the deposited layers between individual substrate tubes having deposited layers of silica. This is unwanted because of very precise product specifications. On the other hand, choosing said length too small would lead to a higher wear of the section and thus to a decreased durability.

In an exemplary embodiment, the liner is made of quartz glass or fused silica. Typically, the transparency of the material of the liner for microwave radiation is at least 98 percent (e.g., at least 99 percent).

In an exemplary embodiment, a length of said at least one section having the reduced inner diameter is in the range of 1 to 20 millimeters, typically in the range of 2 to 10 millimeters. A liner having said at least one section in the aforementioned range is also advantageously applicable with apparatuses not having a microwave generator. Therefore, an aspect of the invention also relates to a plasma chemical vapor deposition apparatus for deposition of one or more layers of silica onto an interior wall of an elongated hollow glass substrate tube. An exemplary apparatus includes a plasma generator, a cylindrical cavity extending through the plasma generator, and a cylindrical liner that is positioned in the cavity. A central axis of the liner is coaxial with a central axis of the cavity. The substrate tube passes through the liner in use, wherein, over a part of the length of the liner, the liner has at least one section having a reduced inner diameter with respect to an inner diameter of a remaining part of the liner, the at least one section providing a contact zone for the substrate tube. Typically, the length of said at least one section having the reduced inner diameter is in the range of 1 to 20 millimeters (e.g., in the range of 2 to 10 millimeters). In an exemplary embodiment, the apparatus further includes a microwave generator, wherein the plasma generator receives microwaves from the microwave generator in use and wherein the liner is transparent to microwave radiation.

Effects of such an apparatus having the absolute measure of the length, in the aforementioned range of 1 to 20 millimeters, typically 2 to 10 millimeters, are analogous to the effects as presented (above) in relation to the embodiment of the invention having the length of the section relative to the wavelength. That is, in such embodiments, pollution and damage may also negatively affect temperature stability. Exemplary embodiments described (below) are applicable both to the apparatus having the relative, wavelength-dependent length of the section of the liner, as well as the apparatus having the definition of the length in absolute sense.

The term "inner diameter," as used throughout the present description and claims in relation to the section having the reduced inner diameter, is to be interpreted as covering an inner diameter of a cylinder-shaped inner surface of the section, as well as covering the diameter of an inscribed circle of the inner surface of the section.

The foregoing illustrative summary, other objectives and/or advantages of the present disclosure, and the manner in which the same are accomplished are further explained within the following detailed description and its accompanying drawings.

BRIEF DESCRIPTION OF THE DRAWINGS

The present invention is described hereinafter with reference to the accompanying drawings in which embodiments of the present invention are shown and in which like reference numbers indicate the same or similar elements. The drawings are provided as examples, are schematic, and may not be drawn to scale. The present inventive aspects may be embodied in many different forms and should not be construed as limited to the examples depicted in the drawings.

DETAILED DESCRIPTION

Various aspects and features are herein described with reference to the accompanying figures. Details are set forth to provide a thorough understanding of the present disclosure. It will be apparent, however, to those having ordinary skill in the art that the disclosed plasma chemical vapor deposition (PCVD) apparatus may be practiced or employed without some or all of these specific details. As another example, features disclosed as part of one embodiment can be used in another embodiment to yield a further embodiment. Sometimes well-known aspects are not described in detail to avoid unnecessarily obscuring the present disclosure. This detailed description is thus not to be taken in a limiting sense, and it is intended that other embodiments are within the spirit and scope of the present disclosure.

Figure 1:
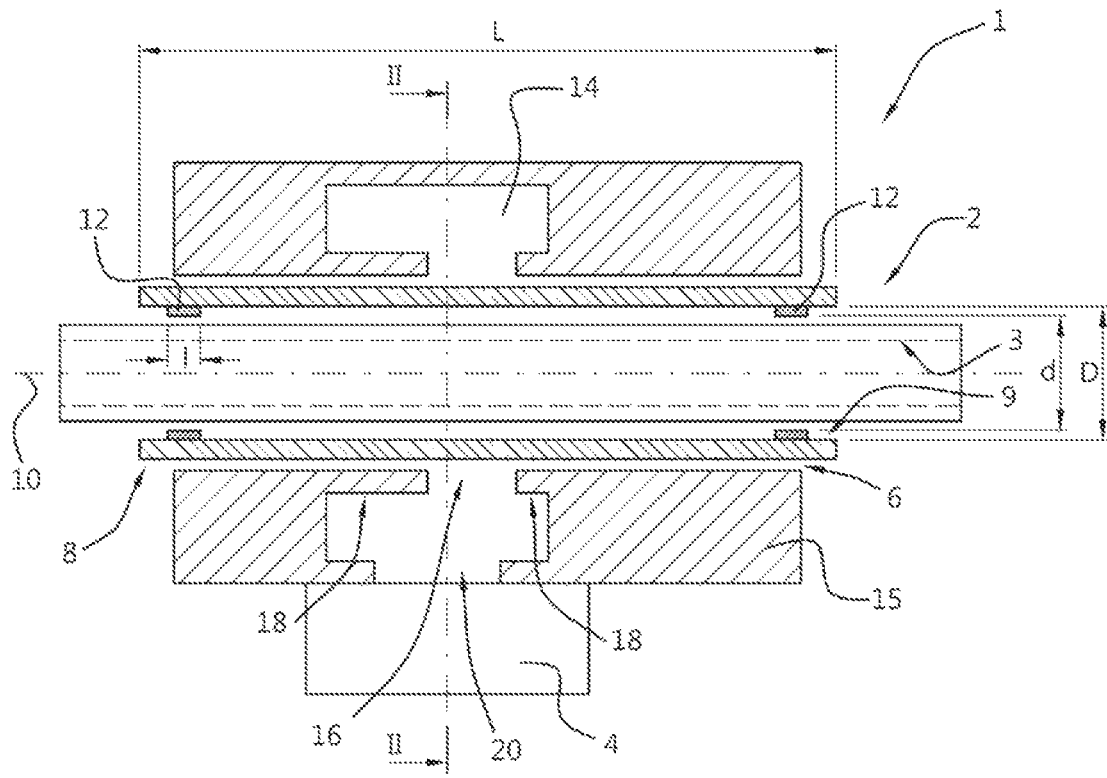
FIG. 1 shows, in vertical cross-section, an exemplary embodiment of a plasma chemical vapor deposition apparatus according to the invention.

FIG. 1 shows a plasma chemical vapor deposition (PCVD) apparatus 1 for deposition of one or more layers of silica onto an interior wall 3 of an elongated hollow glass substrate tube 2. The apparatus 1 comprises a microwave generator 4 configured to generate microwaves having a wavelength Lw in the range of 40 to 400 millimeters (e.g., about 120 millimeters).

In an exemplary embodiment, a length of the at least one section having the reduced inner diameter is at most 0.05× Lw.

In an exemplary embodiment in which the wavelength Lw is about 120 millimeters (e.g., 115-125 millimeters), the length of the at least one section will then at most be about 6 millimeters (and at least 1 millimeter). Typically, the microwave generator generates microwaves of a frequency of about 2.45 GHz, which corresponds to said wavelength. Alternatively, a frequency of about 5.6 GHz may be used or, further alternatively, a frequency of about 890 MHz may be used.

Figure 2:
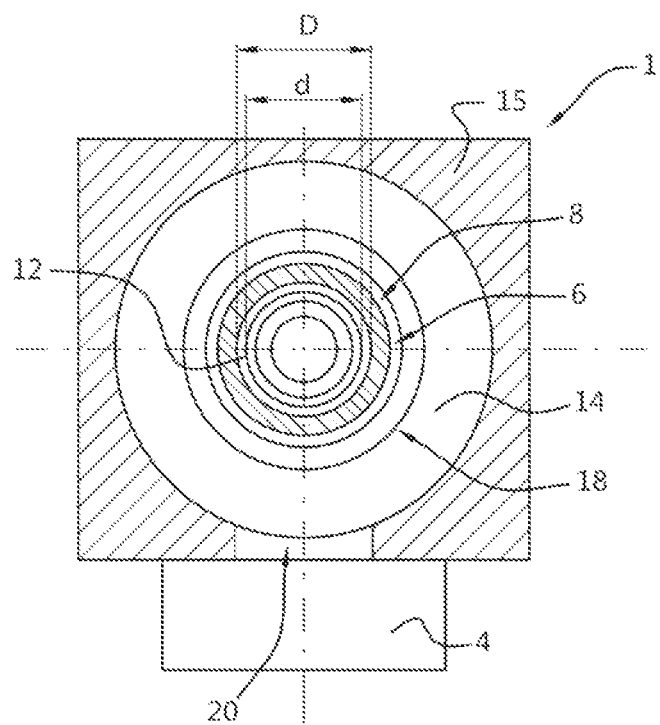
FIG. 2 shows section II-II of the apparatus of FIG. 1.

The apparatus 1 shown in FIGS. 1-2 also has a plasma generator 15 receiving microwaves from the microwave generator 4 in use. The apparatus 1 has a cylindrical cavity 6 extending through the plasma generator and a cylindrical liner 8 made of quartz glass, which is transparent to microwave radiation, and which is positioned in the cylindrical cavity 6. A central axis 10 of the liner 8 is coaxial with a central axis of the cavity 6. The substrate tube 2 passes through the liner 8 in use. In FIG. 2, the substrate tube 2 has not been shown. In use, the apparatus 1 and the substrate tube 2 may be moved axially with respect to each other while flushing a suitable gas through the substrate tube 2 and generating the plasma, so as to deposit silica layers along the length of the substrate tube.

The liner 8 has at least one section 12 having a reduced inner diameter d with respect to an inner diameter D of a remaining part of the liner and, over a part of the length L of the liner 8, the at least one section provides a contact zone for the substrate tube 2. In an exemplary embodiment, a length 1 of said at least one section having the reduced inner diameter d is at most 0.1×Lw (i.e., 0.1 times the wavelength Lw) and is at least 1 millimeter. In the example of Lw being about 120 millimeters, the length of the at least one section will then at most be about 0.1×120=12 millimeters and at least 1 millimeter. In an example, the length 1 of the at least one section 12 having the reduced inner diameter may be in the range of 2-3 millimeters.

In an exemplary embodiment, the plasma generator comprises a microwave resonator cavity surrounding the cylindrical cavity, wherein the microwave generator is connected to the resonator cavity.

An example of such a microwave resonator cavity is the microwave resonator cavity 14 as shown in FIGS. 1-2, formed in the plasma generator 15. This specific microwave resonator cavity 14 revolves about the cylindrical cavity 6 and leaves a slit 16 bounded by inner walls 18, through which slit 16 microwaves may enter the cavity 6. The slit 16 is axially (that means in a direction parallel to the central axis 10) offset with respect to an inlet aperture 20 connecting the microwave resonator cavity 14 to the microwave generator 4, as FIG. 1 shows. As shown in the view of the cross section shown in FIG. 1, the slit 16 is positioned more to the right side with respect to the axial position of the inlet aperture 20 in the plasma generator 15. The exact axial position of the slit 16 relative to the aperture 20 may be dependent on the properties of the inlet aperture and on related microwave generator components.

The microwave generator 4 may have a waveguide that is connected to a microwave generating element. It should be noted that the term "waveguide" as used herein is meant to have a broad meaning and is to be interpreted to relate to all means for efficiently transferring microwave energy from a generating element (e.g., a klystron or a magnetron) to the resonator cavity. More particularly, the term comprises specific means such as an antenna, a coaxial guide, a waveguide (e.g., a rectangular waveguide), and the like.

In an exemplary embodiment, a length of said at least one section having the reduced inner diameter is in the range of 1 to 20 millimeters, typically in the range of 2 to 10 millimeters.

In an exemplary embodiment, the reduced inner diameter of the liner is in the range of 25 to 100 millimeters, typically in the range of 35 to 65 millimeters.

In the exemplary PCVD apparatus shown in FIGS. 1-2, the reduced inner diameter d of the section 12 of liner 8 may be about 46 millimeters, while an inner diameter D of a remaining part of the liner 8 may be about 50 millimeters.

The inner diameter d may be about 0.2 to 0.8 millimeter larger than an outer diameter of the substrate tube in use within the apparatus. In other words, the apparatus is typically for use with substrate tubes having an outer diameter about 0.2 to 0.8 millimeter smaller than the inner diameter d of the at least one section having the reduced inner diameter.

In an exemplary embodiment, the inner diameter of the remaining part of the liner is at least 2 percent larger than the inner diameter of said at least one section. Such a diameter difference is sufficient in view of the purpose of avoiding contact between the substrate tube and the inner wall of a remaining part of the liner.

In an exemplary embodiment, the at least one section is formed by attaching an inner ring to an inner wall of the liner, wherein the reduced inner diameter of the section is defined by an inner diameter of the ring. The inner ring and a cylindrical remaining part of the liner may thus be manufactured independently of each other, after which the inner ring is attached to the cylindrical remaining part, so as to obtain the liner having a section having a reduced inner diameter. For example, the inner ring may be melted onto the inner wall of the liner.

The liner 8 as shown in FIGS. 1-2 can be manufactured by first individually manufacturing a cylindrical part of the liner and two inner rings, after which the inner rings 12 are melted onto the inner wall 9 of the remaining part of the liner, thereby obtaining the liner 8.

In an exemplary embodiment, the liner and the inner ring are made of the same material.

In an exemplary embodiment, the at least one section is formed by locally collapsing the liner. Alternatively, or as a further manufacturing step of the local collapsing, the at least one section may be formed by machining, such as turning, the inside of the liner.

The inner diameter of a mentioned section defined by a cylindrical inner ring or defined by another such cylinder-shaped part like a section resulting from turning the inside of the liner, is the inner diameter of the inner ring (i.e., the diameter of the inner surface of such an inner ring, or the inner diameter of the turned inner surface of such a turned section). The inner surface of the section, however, does not need to be circular per se. The section may have a number of inwardly protruding support blocks (e.g., three such blocks) spaced apart in circumferential direction and defining an inscribed circle defining the inner diameter of the section.

In an exemplary embodiment, the liner comprises at most three, typically one or two, more typically two, of such sections having a reduced inner diameter, the at most three sections being spaced apart along the length of the liner. Each of the sections has a length in the ranges as discussed (above). In case of two such sections, they may be provided, for example, at or close to the respective opposite ends of the liner. The provision of at most three such sections, typically one or two, more typically two, is sufficient for supporting the substrate tube in use (e.g., to contact the substrate tube in order to avoid an unwanted amount of bending of the tube).

In the exemplary embodiment shown in FIGS. 1-2, the liner 8 has two such sections 12, spaced apart such that the sections 12 are close to opposite ends of the liner 8.

In exemplary embodiments not including a microwave generator, the plasma generator may comprise a coil positioned such that it surrounds the cylindrical cavity, the coil being connected to or at least connectable to an RF-signal source, such that an electromagnetic flux is generated within the substrate tube in use.

Other variations of the disclosed embodiments can be understood and effected by those of ordinary skill in the art in practicing the present invention by studying the drawings, the disclosure, and the appended claims. I In the claims, the word "comprising" does not exclude other elements or steps, and the indefinite article "a" or "an" does not exclude a plurality. Unless otherwise specified, numerical ranges are intended to include the endpoints.

It is within the scope of this disclosure for one or more of the terms "substantially," "about," "approximately," and/or the like, to qualify each adjective and adverb of the foregoing disclosure, to provide a broad disclosure. As an example, it is believed those of ordinary skill in the art will readily understand that, in different implementations of the features of this disclosure, reasonably different engineering tolerances, precision, and/or accuracy may be applicable and suitable for obtaining the desired result. Accordingly, it is believed those of ordinary skill will readily understand usage herein of the terms such as "substantially," "about," "approximately," and the like.

The use of the term "and/or" includes any and all combinations of one or more of the associated listed items. The exemplary figures are schematic representations and so are not necessarily drawn to scale. Unless otherwise noted, specific terms have been used in a generic and descriptive sense and not for purposes of limitation.

While various aspects, features, and embodiments have been disclosed herein, other aspects, features, and embodiments will be apparent to those having ordinary skill in the art. The various disclosed aspects, features, and embodiments are for purposes of illustration and are not intended to be limiting. It is intended that the scope of the present invention includes at least the following claims and their equivalents:

The invention claimed is:

1. A plasma chemical vapor deposition apparatus for deposition of one or more layers of silica onto an interior wall of an elongated hollow glass substrate tube, the apparatus comprising:
   a microwave generator;
   a plasma generator receiving microwaves from the microwave generator in use;
   a cylindrical cavity extending through the plasma generator; and
   a cylindrical liner that is transparent to microwave radiation and that is positioned in the cavity, a central axis of the liner being coaxial with a central axis of the cavity, wherein the substrate tube passes through the liner in use, wherein, over a part of the length of the liner, the liner has at least one section having a reduced inner diameter with respect to an inner diameter of a remaining part of the liner, said at least one section having a reduced inner diameter providing a contact zone for the substrate tube;
   wherein the microwave generator is configured to generate microwaves having a wavelength $L_w$ in the range of 40 millimeters to 400 millimeters; and wherein said at least one section having the reduced inner diameter has a length of at least 1 millimeter and at most 0.1×Lw.

2. The apparatus according to claim 1, wherein the length of said at least one section having the reduced inner diameter is at most 0.05×Lw.

3. The apparatus according to claim 1, wherein the microwave generator is configured to generate microwaves having a wavelength Lw of about 120 millimeters.

4. The apparatus according to claim 1, wherein the plasma generator comprises a microwave resonator cavity surrounding the cylindrical cavity, wherein the microwave generator is connected to the resonator cavity.

5. The apparatus according to claim 1, wherein the length of said at least one section having the reduced inner diameter is inclusively between 1 millimeter and 20 millimeters.

6. The apparatus according to claim 1, wherein the length of said at least one section having the reduced inner diameter is inclusively between 2 millimeters and 10 millimeters.

7. The apparatus according to claim 1, wherein the reduced inner diameter of the liner is inclusively between 25 millimeters and 100 millimeters.

8. The apparatus according to claim 1, wherein the reduced inner diameter of the liner is inclusively between 35 millimeters and 65 millimeters.

9. The apparatus according to claim 1, wherein said inner diameter of said remaining part of the liner is at least 2 percent larger than the reduced inner diameter of said at least one section.

10. The apparatus according to claim 1, wherein the liner is made of quartz glass or fused silica.

11. The apparatus according to claim 1, wherein said at least one section having the reduced inner diameter is formed by attaching an inner ring to an inner wall of the liner, wherein an inner diameter of the ring defines the reduced inner diameter of said at least one section.

12. The apparatus according to claim 11, wherein the inner ring is melted onto the inner wall of the liner.

13. The apparatus according to claim 11, wherein the liner and the inner ring are made of the same material.

14. The apparatus according to claim 1, wherein said at least one section having the reduced inner diameter is formed by locally collapsing the liner.

15. The apparatus according to claim 1, wherein said at least one section having the reduced inner diameter is formed by machining the liner.

16. The apparatus according to claim 1, wherein the liner comprises at most three sections having the reduced inner diameter, said sections being spaced apart along the length of the liner.

17. The apparatus according to claim 1, wherein the liner comprises two sections having the reduced inner diameter.

* * * * *